(12) United States Patent
Won et al.

(10) Patent No.: US 8,408,928 B2
(45) Date of Patent: Apr. 2, 2013

(54) CONNECTOR AND DISPLAY APPARATUS HAVING THE SAME

(75) Inventors: Joo-Yeon Won, Seoul (KR); YongSoon Lee, Cheonan-si (KR); Seunghwan Moon, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/086,518

(22) Filed: Apr. 14, 2011

(65) Prior Publication Data
US 2012/0142222 A1 Jun. 7, 2012

(30) Foreign Application Priority Data
Dec. 2, 2010 (KR) .................. 10-2010-0122276

(51) Int. Cl.
*H01R 12/24* (2006.01)
(52) U.S. Cl. ..................................... 439/260
(58) Field of Classification Search ............... 439/260, 439/267, 495, 497, 607.47, 607.41; 29/380; 361/749
See application file for complete search history.

(56) References Cited

U.S. PATENT DOCUMENTS

| | | | | |
|---|---|---|---|---|
| 3,701,071 A | * | 10/1972 | Landman | 200/5 R |
| 4,023,878 A | * | 5/1977 | Hennessey | 439/65 |
| 4,718,859 A | * | 1/1988 | Gardner | 439/329 |
| 4,778,403 A | * | 10/1988 | Ikesugi et al. | 439/329 |
| 5,462,441 A | * | 10/1995 | Renn et al. | 439/67 |
| 6,319,052 B1 | * | 11/2001 | Chang | 439/495 |
| 6,685,495 B1 | * | 2/2004 | Ko | 439/353 |
| 6,790,074 B1 | * | 9/2004 | Chiu | 439/495 |
| 6,966,784 B2 | * | 11/2005 | Van Schuylenbergh et al. | 439/67 |
| 7,086,893 B2 | * | 8/2006 | Liu et al. | 439/495 |

FOREIGN PATENT DOCUMENTS

| | | |
|---|---|---|
| JP | 2002-175855 A | 6/2002 |
| KR | 1020070021677 A | 2/2007 |
| KR | 1020080085590 A | 9/2008 |

\* cited by examiner

*Primary Examiner* — Alexander Gilman
(74) *Attorney, Agent, or Firm* — Cantor Colburn LLP (57) ABSTRACT

A connector is used to transmit a signal from a flexible board to an external device. The connector includes an actuator, a supporter, contact terminals, and an outer cover. The actuator includes a body having a slit opened to a front surface and extended in a longitudinal direction of the slit, and a pivot positioned at opposing longitudinal ends of the body. The slit receives the flexible board inserted from the front surface direction. The actuator is rotated with reference to the pivot. The supporter extends in the longitudinal direction and is adjacent to the front surface of the actuator. The contact terminals extend through the supporter and the body, and protrude into the slit. The actuator receives the flexible board when at a first position, and each contact terminal makes contact with the flexible board when the actuator is at a second position different from the first position.

22 Claims, 5 Drawing Sheets

CONNECTOR AND DISPLAY APPARATUS HAVING THE SAME

This application claims priority to Korean Patent Application No. 10-2010-0122276 filed on Dec. 2, 2010, and all the benefits accruing therefrom under 35 U.S.C. §119, the contents of which are herein incorporated by reference in its entirety.

BACKGROUND OF THE INVENTION (1.) Field of the Invention

The present invention relates to a connector and a display apparatus having the same.

(2.) Description of the Related Art

Various display apparatuses, such as a liquid crystal display, a plasma display panel, an electrophoretic display, etc., are extensively applied to electronic devices, such as a computer monitor, a television set or the like.

The display apparatus includes a display panel to display an image and, in general, further needs a converter to convert an image signal from a controller, to a driving signal. The controller and the converter are connected to each other through a connector.

BRIEF SUMMARY OF THE INVENTION

Exemplary embodiments of the present invention provide a connector capable of easily mounting a flexible printed circuit board thereto.

Exemplary embodiments of the present invention provide a display apparatus having the connector.

According to the exemplary embodiments, a connector receives a flexible board therein, and transmits a signal from the flexible board to an external circuit board.

In an exemplary embodiment, the connector includes an actuator, a supporter, contact terminals, and an outer cover.

The actuator includes a body having a slit into which the flexible board is inserted in a first direction and extending in a longitudinal direction of the slit, and a pivot positioned at both of opposing ends of the body in the longitudinal direction. The actuator is rotated with reference to the pivot, and the slit is opened to a front surface of the actuator.

The supporter extends in the longitudinal direction, and is provided adjacent to the front surface of the actuator.

The contact terminals extend through the supporter and the body, to protrude into the inside of the slit.

The actuator receives the flexible board when at a first position, and fixes the flexible board at a second position different from the first position, such that each contact terminal makes contact with the flexible board in the second position.

In an exemplary embodiment, the body includes a bottom portion having a plurality of bottom holes through which the contact terminals respectively extend, and a top portion facing the bottom portion while interposing the slit therebetween. The top portion is partially overlapped with the bottom portion to expose a portion of an upper surface of the bottom portion. A distance between the bottom portion and the top portion gradually decreases from the front surface of the actuator to a rear surface of the actuator.

In an exemplary embodiment, the outer cover surrounds a portion of the actuator and the supporter.

In an exemplary embodiment, the outer cover includes a bottom portion, a first sidewall, a second sidewall, and a cover portion. The bottom portion is substantially parallel to the surface of the circuit board. The first sidewall extends upwardly from the bottom portion and is positioned adjacent to the ends of the body in the longitudinal direction. The second sidewall extends upwardly from the bottom portion and positioned adjacent to the rear surface of the actuator. The cover portion extends from the second sidewall to be parallel to the surface of the circuit board and to limit a rotation angle of the actuator.

In an exemplary embodiment, an angle between the first direction and the surface of the circuit board may be in a range of about 30 degrees to about 40 degrees when the actuator is positioned at the first position.

In an exemplary embodiment, the outer cover may further include a pressure-insertion portion positioned adjacent to the second sidewall, extended from the bottom portion, and protruded to the actuator.

In another exemplary embodiment, a display apparatus includes a printed circuit board that outputs a driving signal, a connector mounted on the printed circuit board, a flexible board inserted into the connector to be coupled with the connector, and a display panel connected to the flexible board and receiving the driving signal from the printed circuit board through the connector and the flexible board, to display an image.

The connector includes an actuator, a supporter, and contact terminals.

The actuator includes a body having a slit receiving the flexible board in a first direction and extending in a longitudinal direction of the slit, and a pivot positioned at both of opposing ends of the body in the longitudinal direction. The actuator is rotated with reference to the pivot, and the slit is opened to a front surface of the actuator. The supporter extends in the longitudinal direction and is provided adjacent to the front surface of the actuator, and the contact terminals extend through the supporter and the body to protrude into the inside of the slit. The actuator receives the flexible board at a first position, and fixes the flexible board at a second position different from the first position, such that each contact terminal makes contact with the flexible board in the second position.

According to the exemplary embodiments, the connector may fix the flexible board solely by insertion and coupling processes, and without employing equipment and additional alignment time, thereby simplifying the processes of coupling the flexible board and the connector. As a result, the manufacturing cost and process time of the display apparatus may be reduced.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings.

In the present invention, a connector is used to transmit a signal and to electrically connect a flexible board and an external device to each other. The flexible board may provide or receive various signals including an image signal, to or from the external device. The flexible board, in general, has a plate-like shape. In the present invention, the flexible board may be a flexible printed circuit board that provides a driving signal to a display panel, but the present invention is not be limited thereto or thereby.

Alternatively, the flexible board may be a flexible flat cable used in various devices in addition to the display apparatus. In the present invention, the flexible board is provided to have a plate-like shape, but it should not be limited thereto. In the present invention, the flexible board is provided in a rectangular plate shape that extends in a direction, and has ends at a right angle to the extended direction.

The following description assumes that the connector is mounted on a surface of an external element, e.g., a printed circuit board. Where the connector has the extended shape, for the convenience of explanation, an opening direction of a slit into which the flexible printed circuit board is inserted is referred to as a front direction or a first direction D1, and an opposite direction to the front direction is referred to as a rear direction or a second direction D2. In the direction in which the connector extends, one direction is referred to as a left direction or a third direction D3, and another direction is referred to as a right direction or a fourth direction D4.

The surface of the external device (e.g., the printed circuit board), with which the connector is equipped, is referred to as a substrate surface. A direction from the substrate surface to the connector is referred to an upper direction or a fifth direction D5, and an opposite direction to the upper direction is referred to as a lower direction or a sixth direction D6. In addition, with respect to parts of the connector, surfaces of each part, which correspond to the above-mentioned directions, respectively, are referred to as a front surface, a rear surface, a left-side surface, a right-side surface, an upper surface, and a lower surface, respectively. The above-mentioned directions may be varied according to a position to which the connector is attached, so that the position of each part may be varied.

Figure 1:
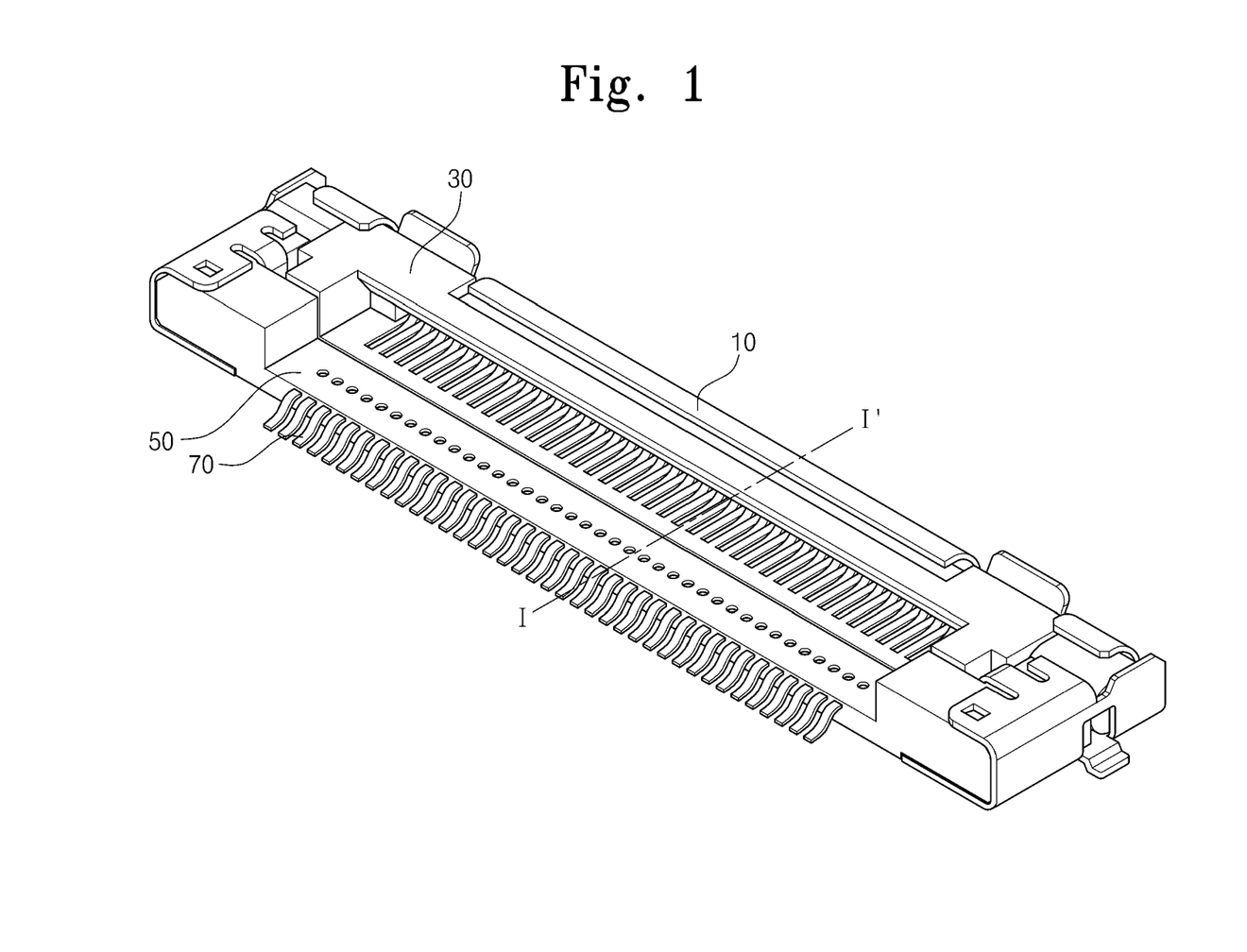
FIG. 1 is perspective view showing an exemplary embodiment of a connector, according to the present invention.
Figure 2:
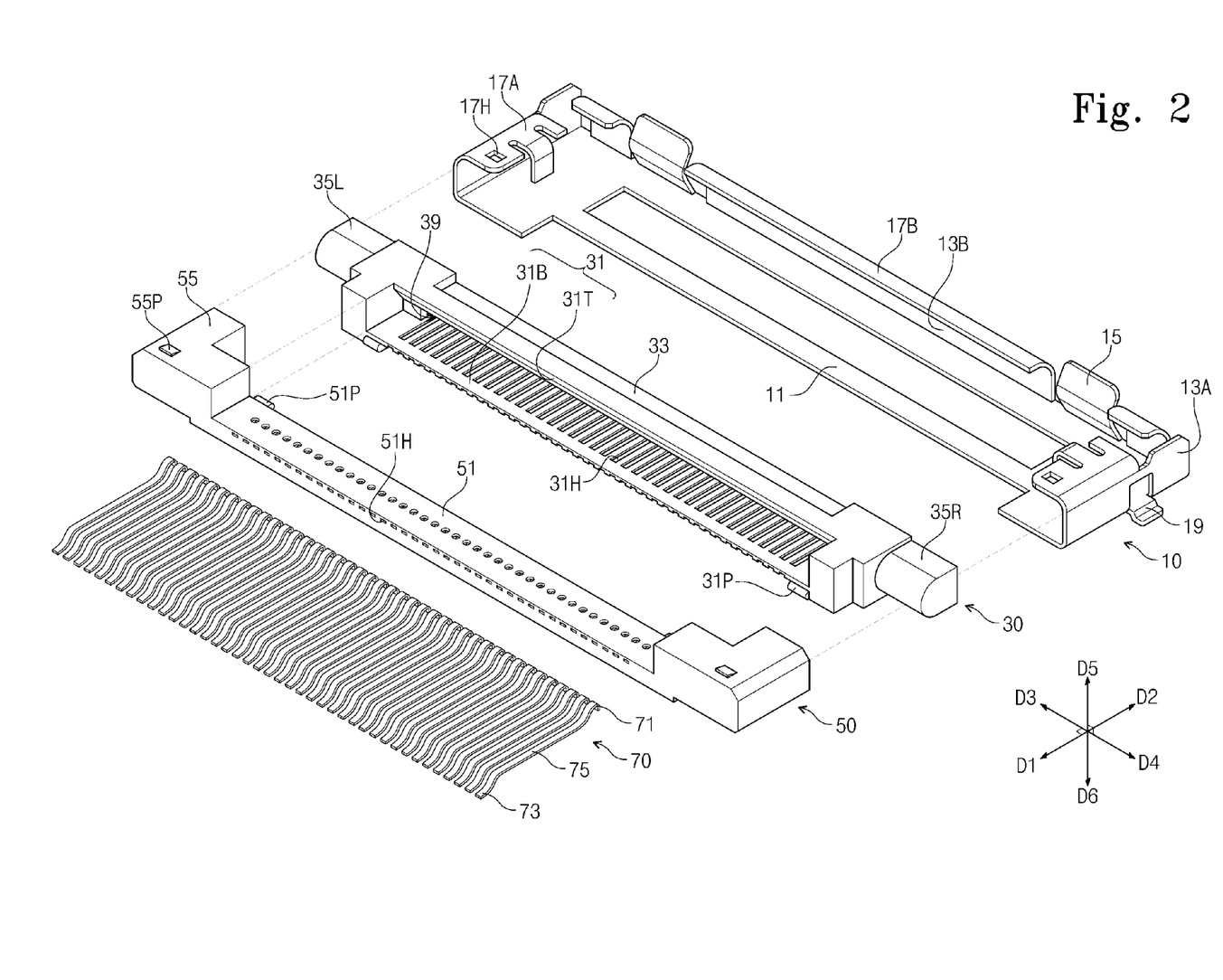
FIG. 2 is an exploded perspective view showing the connector in FIG. 1.
Figure 3:
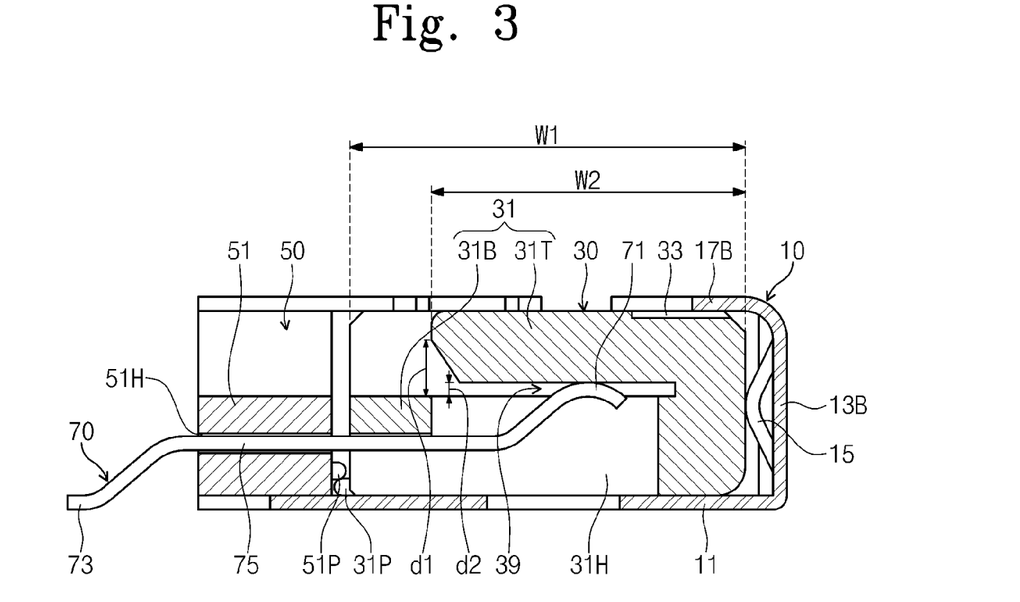
FIG. 3 is a cross-sectional view taken along line I-I' in FIG. 1.

FIG. 1 is perspective view showing an exemplary embodiment of a connector, according to the present invention, FIG. 2 is an exploded perspective view showing the connector in FIG. 1, and FIG. 3 is a cross-sectional view taken along line I-I' in FIG. 1. In FIGS. 1 to 3, only the connector has been shown, and a flexible printed circuit board that is coupled with the connector is omitted.

Referring to FIGS. 1 to 3, a connector includes a plurality of contact terminals 70, a supporter 50 that supports the contact terminals 70, an actuator 30 that receives a flexible board (not shown) to allow the flexible board to make contact with the contact terminals 70, and an outer cover 10 that covers (e.g., overlaps) a portion of both the supporter 50 and the actuator 30.

The actuator 30 serves as an element into which the flexible board is inserted, and has a rectangular parallelepiped shape.

The actuator 30 includes an electrical insulating material of a polymer resin, such as Teflon®, polyethylene, polypropylene, etc. In an exemplary embodiment, the actuator 30 may be formed by using a molding method, and be formed as a single, unitary, indivisible piece (e.g., integral or a monolith).

The actuator 30 includes a body 31 longitudinally extended in the third and fourth directions D3 and D4, and pivots 35L and 35R respectively provided at each of both opposing distal ends of the body 31 in the third and fourth directions D3 and D4.

The body 31 has a slit-shaped space region (hereinafter, referred to as slit) 39 at its front side. The slit 39 has a depth in the second direction D2, and longitudinally extends in the third and fourth directions D3 and D4. Since the flexible board is accommodated in the slit 39, the slit 39 has a shape and/or dimension substantially identical with an outer shape and/or dimension of the flexible board. In the case that the flexible board has a rectangular plate-like shape, the slit 39 has a generally rectangular shape corresponding to the shape of a portion of the flexible board which is inserted into the slit 39. That is, a thickness or width in a vertical direction (e.g., fifth and sixth directions D5 and D6) is relatively short, and a width in a horizontal direction (e.g., first and second directions D1 and D2, and/or third and fourth directions D3 and D4) is relatively long.

The slit 39 is opened to the first direction D1. Since the actuator 30 may be rotated with reference to the pivots 35L and 35R, the direction to which the slit 39 is opened may be varied. The width of the slit 39 in the first and second directions D1 and D2, and in the third and fourth directions D3 and D4, is smaller than a width of the body 31 in the same directions, and thus the slit 39 has a substantially recessed shape without passing through or penetrating the body 31.

The body 31 includes a bottom portion 31B provided below the slit 39, and a top portion 31T provided above the slit 39, with reference to the slit 39. The slit 39 is defined between the bottom portion 31B and the top portion 31T, as illustrated in FIGS. 1 to 3.

The bottom portion 31B has a flat upper surface. The bottom portion 31B is provided with a plurality of bottom holes 31H extended completely through a thickness of the bottom portion 31B in the fifth and sixth directions D5 and D6, that is, vertically passing through the bottom portion 31B. The bottom portion 31B further includes a first cross protrusion 31P protruded from a front surface of the bottom portion 31B in the first direction D1. The bottom holes 31H are used to receive the contact terminals 70. The first cross protrusion 31P is used to couple the actuator 30 and the supporter 50 to each other. Details of the bottom holes 31H and the first cross protrusion 31P will be described in detail later.

The top portion 31T faces the bottom portion 31B while interposing the slit 39 therebetween. The bottom portion 31B and the top portion 31T are connected to each other through a region in which the slit 39 is not formed. The top portion 31T has a width in the first and second directions D1 and D2 smaller than the bottom portion 31B, when viewed in a plan view. When a width between the front surface and the rear surface of the bottom portion 31B is referred to as a first width W1, and a width between the front surface and the rear surface of the top portion 31T is referred to as a second width W2, the first width W1 is larger than the second width W2. Thus, when viewed in a plan view, a portion of the bottom portion 31B is exposed because the portion of the bottom portion 31B is not overlapped with the top portion 31T. The first width W1 being larger than the second width W2 allows the flexible board to slide along the upper surface of the bottom portion 31B, and to be guided and inserted into the slit 39 when the flexible board is coupled with the slit 39.

The top portion 31T has a lower surface that is inclined by a predetermined angle with respect to an upper surface of an external circuit board, e.g., a printed circuit board on which the connector is mounted. With reference to a point where the incline of the lower surface begins, the vertical width of the slit 39 in the first direction D1 is relatively larger than the vertical width of the slit 39 in the second direction D2. That is, a distance between the bottom portion 31B and the top portion 31T becomes smaller from a distal end of the top portion 31T towards the second direction D2 in which the flexible board is inserted.

In detail, when the distance between the bottom portion 31B and the top portion 31T is referred to as a first distance d1 at a position corresponding to the frontmost surface of the top portion 31T, and the distance between the bottom portion 31B and the top portion 31T is referred to as a second distance d2 at a position spaced apart from the frontmost surface of the top portion 31T by a predetermined distance, the first distance d1 is larger than the second distance d2. As described above, the distance between the bottom portion 31B and the top portion 31T is relatively large at the entrance of the slit 39 at the frontmost surface of the top portion 31T, thereby facilitating easy insertion of the flexible board into the slit 39.

The top portion 31T is provided with a recessed portion 33 thereon, to correspond to a second cover portion 17B of the outer cover 10. The recessed portion 33 spaces the top portion 31T apart from the second cover portion 17B, to provide a space in which the actuator 30 may rotate.

The pivots 35L and 35R includes a first pivot 35L positioned at a first end of the body 31 in the third direction D3, and a second pivot 35R positioned at a second end of the body 31 in the fourth direction D4 opposing the first end. Each of the first pivot 35L and the second pivot 35R has a semi-cylindrical shape, such that the actuator 30 may rotate. The actuator 30 rotates in a predetermined angle with reference to an imaginary line connecting the first pivot 35L and the second pivot 35R, such imaginary line defining a pivot axis.

According to the rotation of the actuator 30, the connector is maintained in an open state or a closed state. The closed state means that the upper surface of the bottom portion 31B is positioned substantially in parallel to the upper surface of the external circuit board to which the connector is mounted. Thus, when assuming that the flexible board is inserted into the slit 39, the flexible board electrically makes contact with the contact terminals 70 when the connector is in the closed state.

The open state means that the upper surface of the bottom portion 31B is positioned not in parallel to the upper surface of the external circuit board by rotating the actuator 30 about the first and second pivots 35L and 35R. In this case, although the flexible board is inserted into the slit 39, the flexible board is not electrically connected to the contact terminals 70 when the connector is in the open state.

The supporter 50 is used to support the contact terminals 70 and is provided adjacent to the actuator 30.

The supporter 50 includes an insulating material. The insulating material may be a polymer resin such as Teflon®, polyethylene and polypropylene. In an exemplary embodiment, the supporter 50 may be formed by using the above-mentioned material, through a molding process and be formed as a single, unitary, indivisible piece (e.g., integral or a monolith).

The supporter 50 includes a fixing portion 51 longitudinally extending in the third and fourth directions D3 and D4, and an extending portion 55 connected to each of both opposing ends of the fixing portion 51 and protruding in the second direction D2.

The fixing portion 51 includes a plurality of terminal holes 51H, and a second cross protrusion 51P. The terminal holes 51H are extended completely through a width of the fixing portion 51 taken in the first and second directions D1 and D2, that is, penetrating between a front surface of the fixing portion 51 and a rear surface of the fixing portion 51. The contact terminals 70 are provided in the terminal holes 51H in one-to-one correspondence.

The second cross protrusion 51P is on the rear surface of the fixing portion 51 to correspond to (e.g., be aligned with) the first cross protrusion 31P of the actuator 30. The rear surface of the fixing portion 51 faces the front surface of the actuator 30. When the connector is maintained in the closed state, the second cross protrusion 51P is positioned above the first cross protrusion 31P in the fifth and sixth directions D5 and D6, to face the first cross portion 31P. Accordingly, the second cross protrusion 51P is partially overlapped with the first cross protrusion 31P when viewed in a plan view. When the actuator 30 is in the closed state, the second cross protrusion 51P is positioned above the first cross protrusion 31P, so that the second cross protrusion 51P serves as a stopper, thereby preventing the rotation of the actuator 30.

The extending portion 55 is coupled with the outer cover 10, to fix the contact terminals 70. The extending portion 55 includes a fixing protrusion 55P on an upper surface thereof.

Each of the contact terminals 70 makes contact with the flexible board to transmit signals. The contact terminals 70 are provided in the bottom holes 31H of the actuator 30 in one-to-one correspondence. Thus, the contact terminals 70 are arranged along the third and fourth directions D3 and D4, while longitudinally extending in the first and second directions D1 and D2.

Each of the contact terminals 70 includes a first contact portion 71, a connect portion 75 connected to the first contact portion 71, and a second contact portion 73 connected to the connect portion 75.

The first contact portion 71 extends to inside the slit 39 by passing through the bottom hole 31H from under the bottom portion 31B. The first contact portion 71 makes contact with a lower surface of the flexible board when the actuator 30 is in the closed state. An end of the first contact portion 71 is bent upward to have elastic force, so that the elastic force of the first contact portion 71 acts toward the fifth direction D5 while applying a force to the first contact portion 71 toward the sixth direction D6. Thus, when the actuator 30 is closed after the flexible board is inserted into the slit 39, the first contact portion 71 securely makes contact with the lower surface of the flexible board, thereby fixing the flexible board within the actuator 30.

The second contact portion 73 protrudes from the front surface of the supporter 50 in the first direction D1. In one exemplary embodiment, the second contact portion 73 of the contact terminal 80 may be soldered to wires of the external circuit board to which the connector is mounted.

The connect portion 75 is provided in the terminal hole 51H of the supporter 50, and may extend parallel to a lower surface of the bottom portion 31B of the actuator 30.

The outer cover 10 receives the actuator 30 and the supporter 50 therein, to stably hold the actuator 30 and the supporter 50 in place. The outer cover 10 includes a metal material.

The outer cover 10 includes a bottom portion 11, sidewalls 13A and 13B connected to the bottom portion 11, a pressure-insertion portion 15 positioned adjacent to the sidewalls 13A and 13B and connected to the bottom portion 11, and cover portions 17A and 17B connected to the sidewalls 13A and 13B, respectively.

The sidewalls 13A and 13B include a first sidewall 13A and a second sidewall 13B. The cover portions 17A and 17B include a first cover portion 17A connected to the first sidewall 13A, and a second cover portion 17B connected to the second sidewall 13B.

The bottom portion 11 is substantially parallel to the upper surface of the external circuit board to which the connector is mounted, and longitudinally extends in the third and fourth directions D3 and D4. The bottom portion 11 of the outer cover 10 may have a similar shape to the lower surface of the supporter 50 and the actuator 30. In addition, the bottom portion 11 may be provided with openings therein.

The first sidewall 13A is positioned adjacent to the end of the body 31 of the actuator 30 in the longitudinal direction of the body 31, and extends upward from the bottom portion 11 in the fifth direction D5. The first sidewall 13A may be provided with a coupling protrusion 19 protruding from an outer surface thereof. In an exemplary embodiment, the coupling protrusion 19 may be soldered to the external circuit board to which the connector is mounted, to firmly fix the connector to the external circuit board.

The first cover portion 17A extends from the first sidewall 13A in the third and fourth directions D3 and D4, and substantially in parallel to the upper surface of the external circuit board to which the connector is mounted. The first cover portion 17A is provided with a thru-hole 17H extending completely through a thickness of the first cover portion 17A. The thru-hole 17H is used to prevent the supporter 50 from being separated from the outer cover 10 when the supporter 50 is coupled with the outer cover 10.

Since the supporter 50 is inserted into the outer cover 10 in the second direction D2, the fixing protrusion 55P is positioned inside the thru-hole 17H when the supporter 50 is completely inserted into the outer cover 10. The fixing protrusion 55P does not serve as a stopper while the supporter 50 is inserted into the outer cover 10 along the second direction D2. On the contrary, in order to allow the fixing protrusion 55P to serve as the stopper while the supporter 50 is separated from the outer cover 10 along the first direction D1, the fixing protrusion 55P has a height taken parallel to the fifth and sixth directions D5 and D6, that becomes larger when taken from the second direction D2 in to the first direction D1. As a result, separation of the supporter 50 from the outer cover 1 in the first direction D1 may be reduced or effectively prevented by the fixing protrusion 55P.

The second sidewall 13B is positioned adjacent to the rear surface of the body 31 of the actuator 30, and extends from the bottom portion 11 to the fifth direction D5.

The second cover portion 17B is connected to the second sidewall 13B, and extends in the first direction D1 substantially in parallel to the upper surface of the external circuit board to which the connector is mounted. The second cover portion 17B is partially overlapped with the body 31 of the actuator 30 in a plan view. The second cover portion 17B may prevent the body 31 of the actuator 30 from rotating by more than a predetermined angle. In one exemplary, for instance, the second cover portion 17B controls the actuator 30 to rotate within a range of about 40 degrees or less, with reference to the upper surface of the external circuit board. In addition, the second cover portion 17B supports the actuator 30 such that the actuator 30 does not become separated from other elements of the connector.

The pressure-insertion portion 15 faces the rear surface of the body 31 and extends upward from the bottom portion 11. The pressure-insertion portion 15 is bent at least once or more along the fifth direction D5, and the bending portion protrudes to the first direction D1. Due to the bending portion of the pressure-insertion portion 15, the pressure-insertion portion 15 acts with elastic force when force is applied to the second direction D2 to the bending portion. The pressure-insertion portion 15 pushes the actuator 30 to the front surface direction (first direction D1), to thereby prevent the actuator 30 from moving within the outer cover 10 in the first and second directions D1 and D2. In addition, the first cross protrusion 31P and the second cross protrusion 51P may reduce or effectively prevent separation of the actuator 30 from the outer cover 10 in the fifth direction D5.

In the above-described connector, the flexible board is electrically connected to or separated from the external circuit board to which the connector is mounted, by closing or opening the actuator 30. Hereinafter, for the convenience of explanation, the position of the actuator 30 is referred to as a first position when the actuator 30 is closed, and the position of the actuator 30 is referred to as a second position when the actuator 30 is opened. The first position and the second position may be varied by the rotation of the actuator 30.

The upper surface of the external circuit board to which the connector is mounted and the upper surface of the bottom portion 31B are substantially parallel to each other when the actuator 30 is positioned at the first position, and thus an angle between the upper surface of the external circuit board and the upper surface of the bottom portion 31B is zero degrees. When the actuator 30 is positioned at the second position, the angle between the upper surface of the external circuit board and the upper surface of the bottom portion 31B is a predetermined angle. Hereinafter, in the illustrated exemplary embodiment, the description will be made on the assumption that the second position is referred to as a position at which the actuator 30 rotates in maximum, but the present invention should not be limited thereto or thereby.

Figure 4:
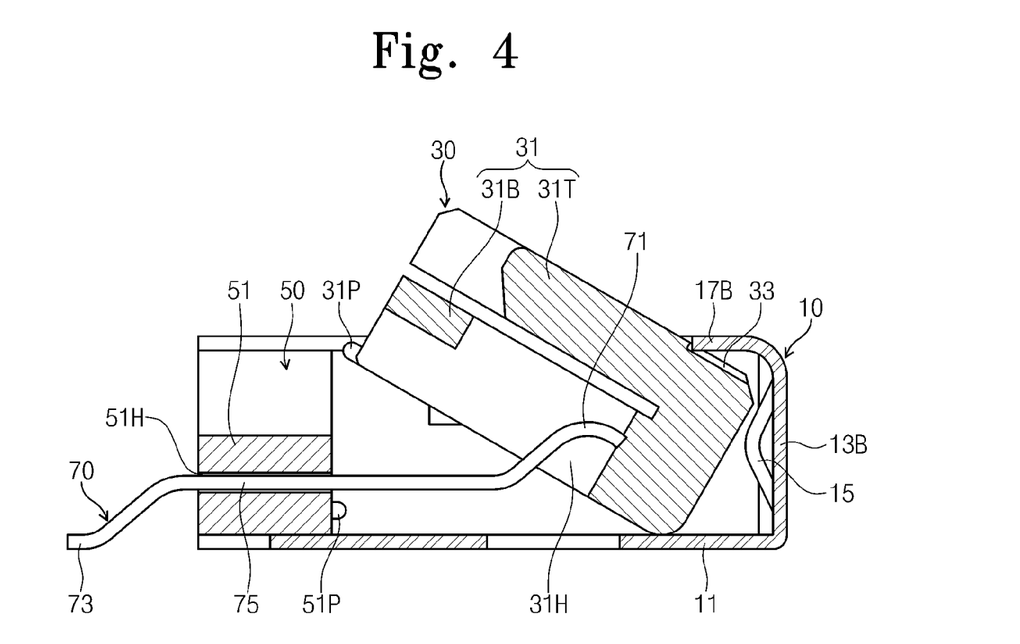
FIG. 4 is a cross-sectional view of the connector when an actuator shown in FIG. 1 is positioned at a second position.
Figure 5:
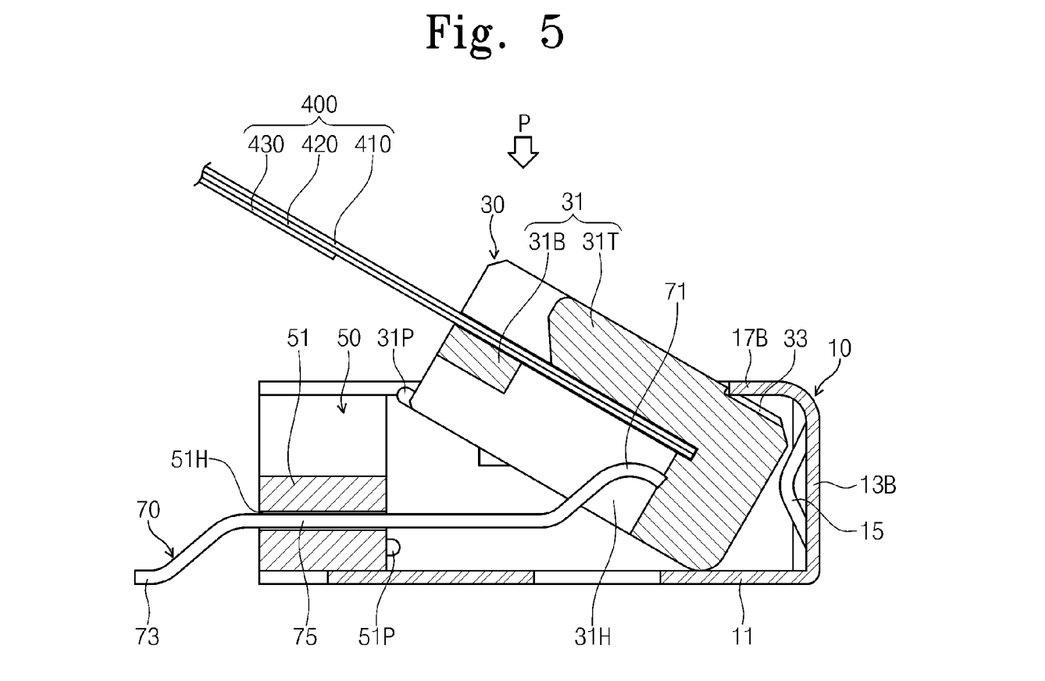
FIG. 5 is a cross-sectional view of the connector when a flexible printed circuit board is inserted into the actuator.
Figure 6:
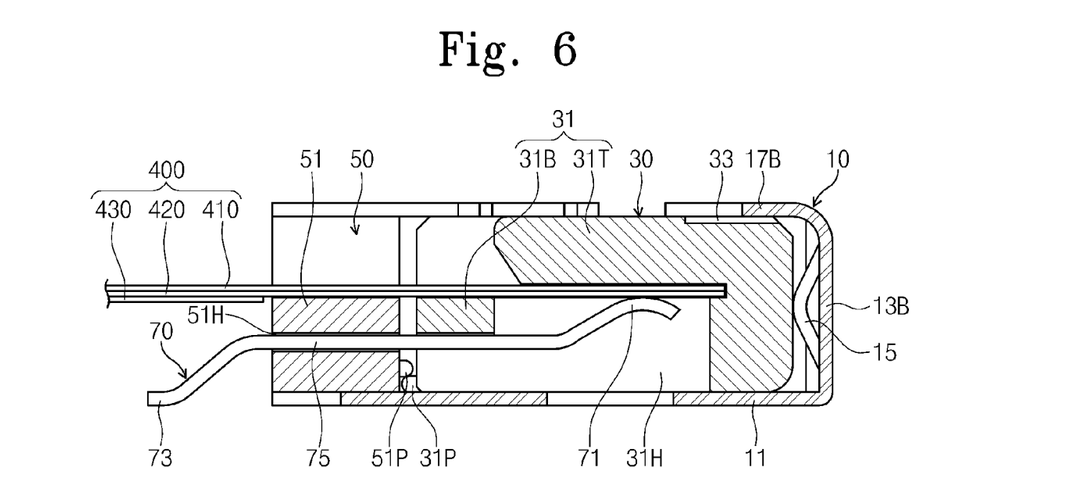
FIG. 6 is a cross-sectional view of the connector when the actuator shown in FIG. 1 is positioned a first position.

FIGS. 4 to 6 are cross-sectional views sequentially illustrating the processes of coupling the connector to the flexible board. FIG. 4 is a cross-sectional view showing the connector when the actuator 30 shown in FIG. 1 is positioned at the second position, FIG. 5 is a cross-sectional view showing the connector when the flexible board is inserted into the actuator 30 at the second position, and FIG. 6 is a cross-sectional view showing the connector when the actuator 30 shown in FIG. 1 is positioned at the first position. Specifically, FIG. 6 shows a flexible board 400 coupled to the connector.

In the illustrated exemplary embodiment, the flexible board 400 includes an insulating film 410 and a metal layer 420 disposed on the insulating film 410. The metal layer 420 may be patterned in various shapes according to a circuit configuration. The metal layer 420 includes a conductive metal material such as copper, nickel, gold, or chrome. The metal layer 420 may have a single-layer structure or a multiple-layer structure, which is composed of the aforementioned materials or alloys thereof. The metal layer 420 may be on one surface or on both surfaces of the insulating film 410. In FIGS. 5 and 6, the flexible board including the metal layer 420 formed only on the one surface of the flexible board 400 has been shown. The insulating film 410 includes an insulating material of a polymer resin, such as polyimide, polyester, etc.

The flexible board 400 may further include a protective layer 430 partially on a surface of the metal layer 420. That is, for the electrical connection between the flexible board 400 and the connector, the protective layer 430 is not in a region of the metal layer 420 at which the flexible board 400 makes contact with the connector. Where the protective layer is not formed, the metal layer 420 is exposed. In one exemplary embodiment, for example, when assuming that the flexible board 400 makes electrically contact with the connector through an end portion thereof, the protective layer 430 is not on the end portion, and the metal layer 420 corresponding to the end portion of the flexible board is exposed to an exterior of the flexible board 400.

Referring to FIG. 4, the actuator 30 is upwardly rotated in maximum such that the actuator 30 is positioned at the second position in order to insert the flexible board 400 into the connector. Since the actuator 30 may be upwardly rotated to make contact with the second cover portion 17B, the rotation angle of the actuator 30 in its maximum opening condition is determined by the second cover portion 17B that serves as a stopper. If there is no second cover portion 17B, the flexible board 400 is difficult to be inserted into the connector because the maximum rotation angle of the actuator 30 cannot be controlled. The second cover portion 17B may have variable length in the first direction D1 to limit the maximum rotation of the actuator 30, and to allow the flexible board 400 to be easily inserted into the slit 39 of the actuator 30. In the illustrated exemplary embodiment, the rotation angle of the actuator 30 defined by the second cover portion 17B may be in a range of about 30 degrees to about 40 degrees, and more particularly about 34 degrees. In this case, the first cross protrusion 31P of the bottom portion 31B is positioned above the second cross protrusion 51P of the supporter 50.

Referring to FIG. 5, the flexible board 400 is inserted into the slit 39 when the actuator 30 is in an opened (second) position. The entrance of the slit 39 is relatively wide and the vertical width of the slit 39 gradually decreases from the first direction D1 to the second direction D2. Accordingly, the flexible board 400 is easily guided into the slit 39 toward the rear surface of the actuator 30. The positioned flexible board 400 is inserted into the slit 39 such that the metal layer 420 is closer to the actuator 30 than the insulating film 410, so that the metal layer 420 may make electrical contact with the contact terminals 70 when the flexible board 400 is coupled with the connector.

Referring to FIG. 6, a pressure P (shown in FIG. 5) is applied to the actuator 30 into which the flexible board 400 is inserted, such that the actuator 30 moves to the sixth direction D6. The actuator 30 is forced to rotate about an axis defined by the imaginary line between the first and second pivots 35L and 35R by the pressure P and to return to the first position, so that the connector is in the closed state.

When the connector is in the closed state, the first cross protrusion 31P is positioned below the second cross protrusion 51P, and is forced to the front direction by the pressure-insertion portion 15. As a result, the first cross protrusion 31P is engaged with the second cross protrusion 51P and the second cross protrusion 51P serves as the stopper, thereby preventing the actuator 30 from returning to the open state.

As shown in FIG. 6, when the flexible board 400 is coupled with the connector and the actuator 30 is in the closed state, each of the contact terminals 70 makes contact with the lower surface of the flexible board 400. Since the contact terminals 70 are forced to the sixth direction D6 by the flexible board 400, the elastic force of the first contact portion 71 acts to the fifth direction D5. Thus, the flexible board 400 is firmly fixed by and is in contact with the contact terminals 70 solely by the actuator 30 being positioned at the first position.

Since the connector according to the illustrated exemplary embodiment may be firmly coupled with the flexible board 400 without using an adhesive, the flexible board 400 may be connected to the connector without using an attaching method such as an outer lead bonding ("OLB") method. That is, the connector may fix the flexible board 400 by insertion and coupling processes, without employing equipment and additional alignment time, thereby simplifying the processes of coupling the flexible board 400 and the connector, and reducing the manufacturing cost and process time.

The connector according to the exemplary embodiments may be used as a connecting member that transmits electrical signals, and thus the connector may be applied to various electric/electronic devices. In one exemplary embodiment, for instance, in a display apparatus, the connector according to the present invention may be used to transmit the electrical signals to a display panel from a printed circuit board.

Figure 7:
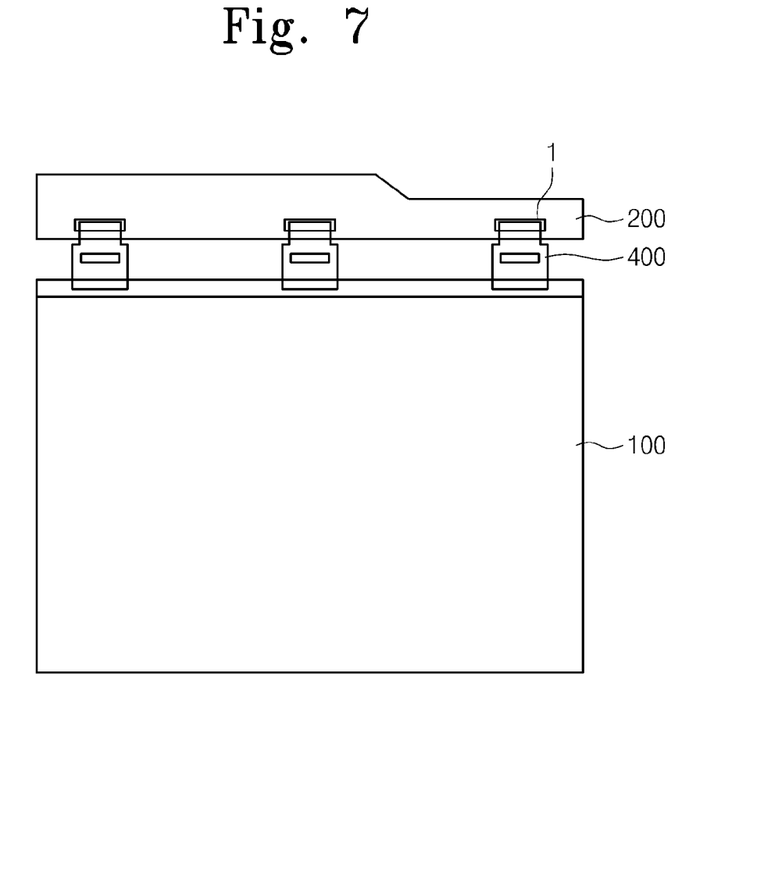
FIG. 7 is a plan view showing an exemplary embodiment of a display apparatus including a connector, according to the present invention.

Hereinafter, a display apparatus employing the connector will be described with reference to FIGS. 7 and 8. FIG. 7 is a plan view showing an exemplary embodiment of a display apparatus including the connector, according to the present invention, and FIG. 8 is a cross-sectional view showing a mounting position of a printed circuit board in the display apparatus shown in FIG. 7.

Figure 8:
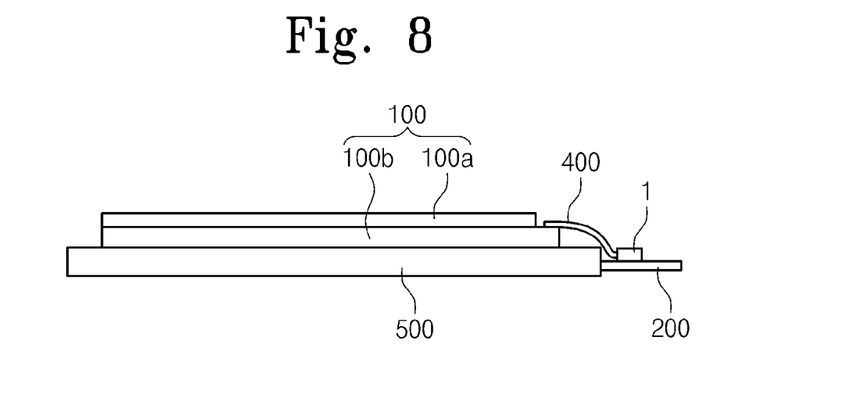
FIG. 8 is a cross-sectional view of a mounting position of a printed circuit board in the display apparatus shown in FIG. 7.

Referring to FIGS. 7 and 8, the display apparatus includes a display panel 100 including an upper substrate 100a and a lower substrate 100b, a printed circuit board 200, the flexible board 400 disposed between the display panel 100 and the printed circuit board 200, and the connector 1 mounted on the printed circuit board 200 to connect the flexible board 400 to the printed circuit board 200. A backlight unit 500 is provided at a rear surface of the display panel 100 to provide light to the display panel 100.

The printed circuit board 200 includes a driving circuit (not shown) to output a driving signal. The driving circuit receives an image signal from a controller (not shown) and converts the image signal such that an image is displayed on the display panel 100.

The connector 1 is mounted on the printed circuit board 200. In one exemplary embodiment, one or more of the contact terminals of the connector 1 is soldered to the printed circuit board 200, so that the electrical signals may be transmitted between the connector 1 and the printed circuit board 200.

The flexible board 400 applies the driving signal output from the printed circuit board 200 to the display panel 100. To this end, a first end of the flexible board 400 is electrically and/or physically connected to the display panel 100, and a second end of the flexible board 400 opposing the first end is electrically and/or physically connected to the connector 1 of the printed circuit board 200.

A method of electrically connecting the flexible board 400 to the printed circuit board 200 may include rotating the actuator 30 of the connector disposed on the printed circuit board 200 to an inclined position relative to an upper surface of the printed circuit board 200, inserting a portion of the flexible board 400 into the slit 39 and onto the top portion 31T of the actuator 30, disposing the plurality of contact terminals 70 extending into the slit 39 of the actuator 30 and extending through a body of the supporter 50 which is a separate element from the actuator 30, rotating the actuator 30 of the connector including the inserted flexible board 400 to a parallel position relative to the upper surface of the printed circuit board 200, contacting the flexible board 400 with the plurality of contact terminals 70, and electrically connecting the flexible board 400 to the printed circuit board 200 solely by the inserting a portion of the flexible board 400 into the slit 39 and by the rotating of the actuator 30 of the connector to a parallel position. In the method, the actuator 30 includes the slit 39 open at a front surface of the actuator 30, and pivots 35L and 35R about which the actuator 30 is rotated. The connector includes the plurality of contact terminals 70 electrically connected to the printed circuit board 200, the supporter 50 adjacent to the front surface of the actuator 30, and a cover 10 within which the actuator 30 is rotated.

In the display apparatus according to the exemplary embodiment, the flexible board 400 is inserted into the rotatable connector 1 mounted on the printed circuit board 200 to be coupled with the connector 1, and thus the flexible board 400 may be easily coupled with the connector 1, and ultimately electronically connected the printed circuit board 200. Accordingly, the process time and cost required to couple the flexible board 400 with the printed circuit board 200 may be reduced.

In addition, the flexible board 400 is inclined with respect to a surface of the printed circuit board 200 on which the connector 1 is mounted while being inserted into the connector 1, so that the flexible board 400 may be easily inserted into the connector 1. Accordingly, the process time and manufacturing cost for the display apparatus may be reduced, thereby improving productivity of the display apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A connector which receives a flexible board therein and transmits a signal from the flexible board to an external circuit board, the connector comprising:
    an actuator including:
        a body including a slit into which the flexible board is inserted in a first direction, and extending in a longitudinal direction of the slit; and
        a pivot at each of opposing ends of the body in the longitudinal direction, and defining a pivot axis,
        wherein the actuator rotates about the pivot axis, and the slit is opened to a front surface of the actuator;
    an outer cover within which the actuator rotates, wherein the outer cover supports rotation of the actuator;
    a supporter extending in the longitudinal direction and adjacent to the front surface of the actuator; and
    a plurality of contact terminals extending through the supporter and into the body of the actuator, and protruding into the slit,
    wherein
    the actuator receives the flexible board when at a first position, and each contact terminal makes contact with the flexible board when the actuator is at a second position different from the first position.

2. The connector of claim 1, wherein the body comprises:
a bottom portion including a plurality of bottom holes through which the contact terminals respectively extend to protrude into the slit; and
a top portion facing the bottom portion while interposing the slit therebetween, the top portion having a width smaller than a width of the bottom portion in the first direction.

3. The connector of claim 2, wherein a distance between the bottom portion and the top portion gradually decreases from the front surface of the actuator to a rear surface of the actuator.

4. The connector of claim 2, wherein each of the contact terminals comprises:
a first contact portion protruded into the slit,
a connect portion directly connected to the first contact portion, and
a second contact portion directly connected to the connect portion and protruded from a front surface of the supporter.

5. The connector of claim 1, wherein the first direction and an upper surface of the external circuit board are substantially parallel to each other at the second position.

6. The connector of claim 1, wherein
the actuator further includes a first cross protrusion protruded from the front surface of the actuator, and
the supporter includes a second cross protrusion protruded from a rear surface of the supporter, which faces the front surface of the actuator.

7. The connector of claim 6, wherein
the first cross protrusion of the actuator is positioned above the second cross protrusion of the supporter when the actuator is positioned at the first position, and
the first cross protrusion of the actuator is positioned below the second cross protrusion of the supporter when the actuator is positioned at the second position.

8. The connector of claim 1, wherein the outer cover surrounds a portion of the actuator and the supporter.

9. The connector of claim 8, wherein the outer cover comprises:
a bottom portion substantially parallel to an upper surface of the external circuit board;
a first sidewall extended upwardly from the bottom portion, and positioned adjacent to the ends of the body in the longitudinal direction;
a second sidewall extended upwardly from the bottom portion and positioned adjacent to a rear surface of the actuator; and
a cover portion extended from the second sidewall and parallel to the upper surface of the external circuit board, wherein the cover portion limits a rotation angle of the actuator.

10. The connector of claim 9, wherein an angle between the first direction and the upper surface of the external circuit board is in a range of about 30 degrees to about 40 degrees, when the actuator is positioned at the first position.

11. The connector of claim 9, wherein the outer cover further comprises a pressure-insertion portion positioned adjacent to the rear surface of the actuator, extended from the bottom portion, and protruded to the rear surface of the actuator.

12. The connector of claim 9, wherein the outer cover further comprises a cover portion extended from the first sidewall and parallel to the upper surface of the external circuit board, and including a thru-hole extended through a thickness of the cover portion extended from the first sidewall.

13. The connector of claim 12, wherein
the supporter further comprises a fixing protrusion protruded from an upper surface of the supporter, and
the fixing protrusion is aligned with the thru-hole of the cover portion, and protrudes into the thru-hole.

14. A display apparatus comprising:
a printed circuit board which outputs a driving signal;
a connector mounted on an upper surface of the printed circuit board;
a flexible board inserted into the connector and coupled with the connector; and
a display panel connected to the flexible board, wherein the display panel receives the driving signal from the printed circuit board through the connector and the flexible board, and displays an image using the driving signal,
wherein the connector comprises:
an actuator including:
a body including a slit into which the flexible board is inserted in a first direction, and extending in a longitudinal direction of the slit, and
a pivot at opposing ends of the body in the longitudinal direction defining a pivot axis,
wherein the actuator rotates about the pivot axis, and the slit is opened to a front surface of the actuator;
an outer cover within which the actuator rotates wherein the outer cover supports rotation of the actuator;
a supporter extending in the longitudinal direction and adjacent to the front surface of the actuator; and
a plurality of contact terminals extending through the supporter and into the body of the actuator, and protruding into the slit,
wherein
the actuator receives the flexible board when at a first position, and
each contact terminal makes contact with the flexible board when the actuator is at a second position different from the first position.

15. The display apparatus of claim 14, wherein the body comprises:
a bottom portion including a plurality of bottom holes through which the contact terminals respectively extend to protrude into the slit; and
a top portion facing the bottom portion while interposing the slit therebetween, the top portion partially overlapping with the bottom portion in a plan view and exposing a portion of an upper surface of the bottom portion.

16. The display apparatus of claim 14, wherein a distance between the bottom portion and the top portion gradually decreases from the front surface of the actuator to a rear surface of the actuator.

17. The display apparatus of claim 14, wherein the first direction is substantially parallel to the upper surface of the printed circuit board on which the connector is mounted, when the actuator is positioned at the second position.

18. The display apparatus of claim 14,
wherein the outer cover surrounds a portion of the actuator and the supporter, and comprises:
a bottom portion substantially parallel to the upper surface of the printed circuit board;
a first sidewall extended upwardly from the bottom portion and positioned adjacent to an end of the body in the longitudinal direction;

a second sidewall extended upwardly from the bottom portion and positioned adjacent to a rear surface of the actuator; and a cover portion extended from the second sidewall and parallel to the upper surface of the printed circuit board, wherein the cover portion limits a rotation angle of the actuator.

19. The display apparatus of claim 18, wherein an angle between the first direction and the upper surface of the printed circuit board is in a range of about 30 degrees to about 40 degrees, when the actuator is positioned at the first position.

20. The display apparatus of claim 14, wherein the printed circuit board is positioned adjacent to a side portion of the display panel, such that the upper surface of the printed circuit board is substantially parallel to a front surface of the display panel.

21. A display apparatus comprising:
   a circuit board which outputs a driving signal;
   a connector on an upper surface of the circuit board;
   a flexible board, of which a portion is in the connector; and
   a display panel connected to the flexible board, wherein the display panel displays images using the driving signal from the circuit board, the driving signal transmitted through the connector and the flexible board to the display panel;
   wherein
   the connector comprises:
      an actuator extending in a longitudinal direction and including:
         a front surface at which a groove is open, the portion of the flexible board being in the groove,
         an upper surface, the portion of the flexible board being on the upper surface,
         a pivot axis about which the actuator rotates,
         a first position where the upper surface of the actuator is inclined with respect to the upper surface of the circuit board; and
         a second position where the upper surface of the actuator is parallel to upper surface of the circuit board;
      contact terminals protruded into the groove of the actuator; and
      a cover within which the actuator rotates, wherein the cover supports rotation of the actuator and
      in the second position of the actuator, the flexible board contacts each of the contact terminals.

22. A method of electrically connecting a flexible board to a circuit board, the method comprising:
   rotating an actuator of a connector disposed on the circuit board, to an inclined position relative to an upper surface of the circuit board;
   inserting a portion of the flexible board into a groove of the actuator and onto an upper surface of the actuator;
   disposing a plurality of contact terminals extending into the groove of the actuator, and extending through a body of a supporter separate from the actuator;
   rotating the actuator of the connector to a parallel position relative to the upper surface of the circuit board;
   contacting the flexible board with the plurality of contact terminals; and
   electrically connecting the flexible board to the circuit board solely by the rotating the actuator of the connector to a parallel position;
   wherein
   the actuator comprises the groove open at a front surface of the actuator, and pivots about which the actuator is rotated; and
   the connector comprises:
      the plurality of contact terminals electrically connected to the circuit board,
      the supporter adjacent to the front surface of the actuator, and
      a cover within which the actuator is rotated wherein the cover supports rotation of the actuator.

\* \* \* \* \*